United States Patent
Crockett et al.

(10) Patent No.: US 9,136,810 B2
(45) Date of Patent: *Sep. 15, 2015

(54) AUDIO GAIN CONTROL USING SPECIFIC-LOUDNESS-BASED AUDITORY EVENT DETECTION

(75) Inventors: Brett Graham Crockett, San Francisco, CA (US); Alan Seefeldt, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 871 days.

This patent is subject to a terminal disclaimer.

(21) Appl. No.: 13/406,929

(22) Filed: Feb. 28, 2012

(65) Prior Publication Data

US 2012/0155659 A1 Jun. 21, 2012

Related U.S. Application Data

(63) Continuation of application No. 12/226,698, filed as application No. PCT/US2007/008313 on Mar. 30, 2007, now Pat. No. 8,144,881.

(60) Provisional application No. 60/795,808, filed on Apr. 27, 2006.

(51) Int. Cl.
*H04R 29/00* (2006.01)
*H03G 5/00* (2006.01)
*H03G 1/00* (2006.01)
(Continued)

(52) U.S. Cl.
CPC ............... *H03G 1/00* (2013.01); *H03G 3/3089* (2013.01); *H03G 7/007* (2013.01); *H03G 9/005* (2013.01)

(58) Field of Classification Search
CPC ....... H04R 29/00; H03G 1/0088; H03G 3/00; H03G 3/001; H03G 3/002; H03G 3/04; H03G 3/32; H03G 3/3005; H03G 3/3089; H03G 7/007; H03G 9/005
USPC ........ 381/56, 80, 81, 94.1–94.3, 98, 101–107
See application file for complete search history.

(56) References Cited

U.S. PATENT DOCUMENTS

2,808,475 A 10/1957 Stryker
4,281,218 A 7/1981 Chuang et al.
(Continued)

FOREIGN PATENT DOCUMENTS

DE 4335739 5/1994
DE 19848491 4/2000
(Continued)

OTHER PUBLICATIONS

Seefeldt, et al.; "A New Objective Measure of Perceived Loudness," Audio Engineering Society (AES) 117.sup.th Convention, Paper 6236, Oct. 28-31, 2004, San Francisco, CA, pp. 1-8.
(Continued)

*Primary Examiner* — Xu Mei

(57) ABSTRACT

In one disclosed aspect, dynamic gain modifications are applied to an audio signal at least partly in response to auditory events and/or the degree of change in signal characteristics associated with said auditory event boundaries. In another aspect, an audio signal is divided into auditory events by comparing the difference in specific loudness between successive time blocks of the audio signal.

13 Claims, 8 Drawing Sheets

(51) Int. Cl.
  *H03G 3/30* (2006.01)
  *H03G 7/00* (2006.01)
  *H03G 9/00* (2006.01)

(56) References Cited

U.S. PATENT DOCUMENTS

| | | |
|---|---|---|
| 4,543,537 A | 9/1985 | Kuhn et al. |
| 4,624,009 A | 11/1986 | Glenn et al. |
| 4,739,514 A | 4/1988 | Short et al. |
| 4,882,762 A | 11/1989 | Waldhauer |
| 4,887,299 A | 12/1989 | Cummins et al. |
| 5,027,410 A | 6/1991 | Williamson et al. |
| 5,097,510 A | 3/1992 | Graupe |
| 5,172,358 A | 12/1992 | Kimura |
| 5,278,912 A | 1/1994 | Waldhauer |
| 5,363,147 A | 11/1994 | Joseph et al. |
| 5,369,711 A | 11/1994 | Williamson, III |
| 5,377,277 A | 12/1994 | Bisping |
| RE34,961 E | 6/1995 | Widin |
| 5,457,769 A | 10/1995 | Valley |
| 5,463,695 A | 10/1995 | Werrbach |
| 5,500,902 A | 3/1996 | Stockham, Jr. et al. |
| 5,530,760 A | 6/1996 | Paisley |
| 5,548,538 A | 8/1996 | Grace et al. |
| 5,583,962 A | 12/1996 | Todd |
| 5,615,270 A | 3/1997 | Miller et al. |
| 5,632,005 A | 5/1997 | Davis |
| 5,633,981 A | 5/1997 | Davis |
| 5,649,060 A | 7/1997 | Ellozy et al. |
| 5,663,727 A | 9/1997 | Vokac |
| 5,682,463 A | 10/1997 | Allen et al. |
| 5,712,954 A | 1/1998 | Dezonno |
| 5,724,433 A | 3/1998 | Engebretson et al. |
| 5,727,119 A | 3/1998 | Davidson |
| 5,819,247 A | 10/1998 | Freund et al. |
| 5,848,171 A | 12/1998 | Stockham, Jr. et al. |
| 5,878,391 A | 3/1999 | Aarts |
| 5,907,622 A | 5/1999 | Dougherty |
| 6,002,776 A | 12/1999 | Bhadkamkar et al. |
| 6,002,966 A | 12/1999 | Loeb et al. |
| 6,041,295 A | 3/2000 | Hinderks |
| 6,061,647 A | 5/2000 | Barrett |
| 6,088,461 A | 7/2000 | Lin et al. |
| 6,094,489 A | 7/2000 | Ishige et al. |
| 6,108,431 A | 8/2000 | Bachler |
| 6,125,343 A | 9/2000 | Schuster |
| 6,148,085 A | 11/2000 | Jung |
| 6,182,033 B1 | 1/2001 | Accardi et al. |
| 6,185,309 B1 | 2/2001 | Attias |
| 6,233,554 B1 | 5/2001 | Heimbigner et al. |
| 6,240,388 B1 | 5/2001 | Fukuchi |
| 6,263,371 B1 | 7/2001 | Geagan, III et al. |
| 6,272,360 B1 | 8/2001 | Yamaguchi et al. |
| 6,275,795 B1 | 8/2001 | Tzirkel-Hancock |
| 6,298,139 B1 | 10/2001 | Poulsen et al. |
| 6,301,555 B2 | 10/2001 | Hinderks |
| 6,311,155 B1 | 10/2001 | Vaudrey et al. |
| 6,314,396 B1 | 11/2001 | Monkowski |
| 6,327,366 B1 | 12/2001 | Uvacek et al. |
| 6,332,119 B1 | 12/2001 | Hinderks |
| 6,351,731 B1 | 2/2002 | Anderson et al. |
| 6,351,733 B1 | 2/2002 | Saunders et al. |
| 6,353,671 B1 | 3/2002 | Kandel et al. |
| 6,370,255 B1 | 4/2002 | Schaub et al. |
| 6,411,927 B1 | 6/2002 | Morin et al. |
| 6,430,533 B1 | 8/2002 | Kolluru et al. |
| 6,442,278 B1 | 8/2002 | Vaudrey et al. |
| 6,442,281 B2 | 8/2002 | Sato et al. |
| 6,473,731 B2 | 10/2002 | Hinderks |
| 6,498,855 B1 | 12/2002 | Kokkosoulis et al. |
| 6,529,605 B1 | 3/2003 | Christoph |
| 6,570,991 B1 | 5/2003 | Scheirer et al. |
| 6,625,433 B1 | 9/2003 | Poirier et al. |
| 6,639,989 B1 | 10/2003 | Zacharov et al. |
| 6,650,755 B2 | 11/2003 | Vaudrey et al. |
| 6,651,040 B1 | 11/2003 | Bakis |
| 6,651,041 B1 | 11/2003 | Juric |
| 6,700,982 B1 | 3/2004 | Geurts et al. |
| 6,731,767 B1 | 5/2004 | Blamey |
| 6,807,525 B1 | 10/2004 | Li et al. |
| 6,823,303 B1 | 11/2004 | Su et al. |
| 6,889,186 B1 | 5/2005 | Michaelis |
| 6,958,644 B2 | 10/2005 | Palaskas |
| 6,985,594 B1 | 1/2006 | Vaudrey et al. |
| 7,065,498 B1 | 6/2006 | Thomas et al. |
| 7,068,723 B2 | 6/2006 | Foote et al. |
| 7,095,860 B1 | 8/2006 | Kemp |
| 7,155,385 B2 | 12/2006 | Berestesky et al. |
| 7,171,272 B2 | 1/2007 | Blamey et al. |
| 7,212,640 B2 | 5/2007 | Bizjak |
| 7,283,954 B2 | 10/2007 | Crockett |
| 7,454,331 B2 | 11/2008 | Vinton |
| 7,461,002 B2 | 12/2008 | Crockett |
| 7,551,745 B2 | 6/2009 | Gundry |
| 7,610,205 B2 | 10/2009 | Crockett |
| 7,617,109 B2 | 11/2009 | Smithers |
| 7,711,123 B2 | 5/2010 | Crockett |
| 8,054,948 B1 | 11/2011 | Gailloux |
| 8,090,120 B2 | 1/2012 | Seefeldt |
| 8,144,881 B2 * | 3/2012 | Crockett et al. ............ 381/56 |
| 8,230,243 B2 | 7/2012 | Fujiwara |
| 8,428,270 B2 * | 4/2013 | Crockett et al. ............ 381/56 |
| 8,488,809 B2 | 7/2013 | Seefeldt |
| 2001/0027393 A1 | 10/2001 | Touimi |
| 2001/0038643 A1 | 11/2001 | McParland |
| 2002/0013698 A1 | 1/2002 | Vaudrey |
| 2002/0040295 A1 | 4/2002 | Saunders |
| 2002/0051546 A1 | 5/2002 | Bizjak |
| 2002/0076072 A1 | 6/2002 | Cornelisse |
| 2002/0097882 A1 | 7/2002 | Greenberg |
| 2002/0146137 A1 | 10/2002 | Kuhnel |
| 2002/0147595 A1 | 10/2002 | Baumgarte |
| 2002/0173864 A1 | 11/2002 | Smith |
| 2003/0002683 A1 | 1/2003 | Vaudrey |
| 2003/0035549 A1 | 2/2003 | Bizjak |
| 2003/0223597 A1 | 12/2003 | Puria |
| 2004/0013272 A1 | 1/2004 | Reams |
| 2004/0024591 A1 | 2/2004 | Boillot |
| 2004/0037421 A1 | 2/2004 | Truman |
| 2004/0042617 A1 | 3/2004 | Beerends |
| 2004/0076302 A1 | 4/2004 | Christoph |
| 2004/0184537 A1 | 9/2004 | Geiger |
| 2004/0190740 A1 | 9/2004 | Chalupper |
| 2005/0013443 A1 | 1/2005 | Marumoto |
| 2005/0027766 A1 | 2/2005 | Ben |
| 2005/0267744 A1 | 12/2005 | Nettre |
| 2005/0276425 A1 | 12/2005 | Forrester |
| 2006/0126865 A1 | 6/2006 | Blamey |
| 2006/0182290 A1 | 8/2006 | Yano |
| 2006/0215852 A1 | 9/2006 | Troxel |
| 2007/0258603 A1 | 11/2007 | Avendano |
| 2007/0274538 A1 | 11/2007 | Van Reck |

FOREIGN PATENT DOCUMENTS

| | | |
|---|---|---|
| DE | 1 736 966 | 11/2007 |
| EP | 0517233 | 12/1992 |
| EP | 0525544 | 2/1993 |
| EP | 0637011 | 2/1995 |
| EP | 0661905 | 7/1995 |
| EP | 0746116 | 12/1996 |
| EP | 1239269 | 9/2002 |
| EP | 1251715 | 10/2002 |
| EP | 1387487 | 2/2004 |
| EP | 1601171 | 11/2005 |
| FR | 2820573 | 8/2002 |
| JP | 10074097 | 7/1996 |
| JP | 2004-356894 | 12/2004 |
| KR | 940003351 | 4/1994 |
| SU | 720691 | 3/1980 |
| TW | 318926 | 11/1997 |
| TW | 563094 | 11/2003 |
| WO | 98/20482 | 5/1998 |
| WO | 9827543 | 6/1998 |

(56) References Cited

FOREIGN PATENT DOCUMENTS

| WO | 99/29114 | 6/1999 |
|---|---|---|
| WO | 0019414 | 4/2000 |
| WO | 0078093 | 12/2000 |
| WO | 02/15587 | 2/2002 |
| WO | 0217678 | 2/2002 |
| WO | 03090208 | 10/2003 |
| WO | 2004/019656 | 3/2004 |
| WO | 2004/073178 | 8/2004 |
| WO | 2004/111994 | 12/2004 |
| WO | 2005/086139 | 9/2005 |
| WO | 2005104360 | 11/2005 |
| WO | 2006/006977 | 1/2006 |
| WO | 2006003536 | 1/2006 |
| WO | 2006/019719 | 2/2006 |
| WO | 2006/047600 | 5/2006 |
| WO | 2006058361 | 6/2006 |
| WO | 2006/113047 | 10/2006 |
| WO | 2006/113062 | 10/2006 |
| WO | 2007/016107 | 2/2007 |
| WO | 2007/120452 | 10/2007 |
| WO | 2007/120453 | 10/2007 |
| WO | 2007/123608 | 11/2007 |
| WO | 2007/127023 | 11/2007 |
| WO | 2008/051347 | 5/2008 |
| WO | 2008/057173 | 5/2008 |
| WO | 2008/085330 | 7/2008 |
| WO | 2008/115445 | 9/2008 |
| WO | 2008/156774 | 12/2008 |

OTHER PUBLICATIONS

Chalupper, Josef; "Aural Exciter and Loudness Maximizer: What's Psychoacoustic about Psychoacoustic Processors?," Audio Engineering Society (AES) 108.sup.th Convention, Sep. 22-25, 2000, Los Angeles, CA, pp. 1-20.

Claro Digital Perception Processing; "Sound Processing with a Human Perspective," pp. 1-8.

Masciale, John M.; "The Difficulties in Evaluating A—Weighted Sound Level Measurements," S&V Observer, pp. 2-3.

Ghent, Jr., et al.; "Expansion as a Sound Processing Tool in Hearing Aids," American Academy of Audiology National Convention, Apr. 29-May 2, 1999, Miami Beach, FL.

Ghent, Jr., et al.; "Uses of Expansion to Promote Listening Comfort with Hearing Aids," American Academy of Audiology 12.sup.th Annual Convention, Mar. 16-19, 2000, Chicago, IL.

Martinez G., Isaac; "Automatic Gain Control (AGC) Circuits—Theory and Design," University of Toronto ECE1352 Analog Integrated Circuits 1, Term Paper, Fall 2001, pp. 1-25.

Park, et al.; "High Performance Digital Hearing Aid Processor with Psychoacoustic Loudness Correction," IEEE FAM P3.1 0-7803-3734-4/97, pp. 312-313.

Bray, et al.; "Optimized Target Matching: Demonstration of an Adaptive Nonlinear DSP System," Sonic Innovations vol. 1 No. 2 1998, pp. 1-4, presented at the American Academy of Audiology, Los Angeles, CA, Apr. 4, 1998.

Bray, et al.; "An "Optimized" Platform for DSP Hearing Aids," Sonic Innovations, vol. 1 No. 3 1998, pp. 1-4, presented at the Conference on Advanced Signal Processing Hearing Aids, Cleveland, OH, Aug. 1, 1998.

Bray, et al.; "Digital Signal Processing (DSP) Derived from a Nonlinear Auditory Model," Sonic Innovations, vol. 1 No. 1 1998, pp. 1-3, presented at American Academy of Audiology, Los Angeles, CA, Apr. 4, 1998.

Ghent, Jr., et al.; "Uses of Expansion to Promote Listening Comfort with Hearing Aids," Sonic Innovations, vol. 3 No. 2, 2000, pp. 1-4, presented at American Academy of Audiology 12.sup.th Annual Convention, Chicago, IL, Mar. 16-19, 2000.

Nilsson, et al.; "The Evolution of Multi-channel Compression Hearing Aids," Sonic Innovations, Presented at American Academy of Audiology 13.sup.th Convention, San Diego, CA, Apr. 19-22, 2001.

Johns, et al.; "An Advanced Graphic Equalizer Hearing Aid: Going Beyond Your Home Audio System," Sonic Innovations Corporation, Mar. 5, 2001, Http://www.audiologvonline.com/articles/pf.sub.--arc.sub.--disp.asp?id=27- 9.

Smith, et al., "Tandem-Free VoIP Conferencing: A Bridge to Next-Generation Networks," IEEE Communications Magazine, IEEE Service Center, New York, NY, vol. 41, No. 5, May 2003, pp. 136-145.

H. H. Scott, "The Amplifier and Its Place in the High Fidelity System," J. Audio Eng. Soc., vol. 1, No. 3, Jul. 1953.

Nigro, et al., "Concert-Hall Realism through the Use of Dynamic Level Control," J. Audio Eng. Soc., vol. 1, No. 1, Jan. 1953.

Newcomb, et al., "Practical Loudness: an Active Circuit Design Approach," J. Audio eng. Soc., vol. 24, No. 1, Jan./Feb. 1976.

Robinson, et a., Dynamic Range Control via Metadata, 107.sup.th Convention of the AES, Sep. 14-27, 1999, New York.

Watson, et al., "Signal Duration and Signal Frequency in Relation to Auditory Sensitivity," Journal of the Acoustical Society of America, vol. 46, No. 4 (Part 2) 1969, pp. 989-997.

ATSC Standard A52/A: Digital Audio Compression Standard (AC-3), Revision A, Advanced Television Systems Committee, Aug. 20, 2001. The A/52A document is available on the World Wide Web at http://www./atsc.org..sub.--standards.html.

Todd, et al., "Flexible Perceptual Coding for Audio Transmission and Storage," 96.sup.th Convention of the Audio Engineering Society, Feb. 26, 1994, Preprint, 3796.

Davis, Mark, "The AC-3 Multichannel Coder," Audio engineering Society, Preprint 3774, 95.sup.th AES Convention, Oct. 1993.

Bosi, et al., "High Quality, Low-Rate Audio Transform Coding for Transmission and Multimedia Applications," Audio Engineering Society Preprint 3365, 93.sup.rd AES Convention, Oct. 1992.

Fielder, et al., "Introduction to Dolby Digital Plus, an Enhancement to the Dolby Digital Coding System," AES Convention Paper 6196, 117.sup.th AES Convention, Oct. 28, 2004.

Truman, et al., "Efficient Bit Allocation, Quantization, and Coding in an Audio Distribution System," AES Preprint 5068, 107.sup.th AES Conference, Aug. 1999.

Fielder, et al., "Professional Audio Coder Optimized fro Use with Video," AES Preprint 5033, 107.sup.th AES Conference, Aug. 1999.

Brandenburg, et al., "Overview of MPEG Audio: Current and Future Standards for Low-Bit-Rate Audio Coding," J. Audio eng. Soc., vol. 45, No. 1/2, Jan./Feb. 1997.

Vernon, Steve, "Design and Implementation of AC-3 Coders," IEEE Trans. Consumer Electronics, vol. 41, No. 3, Aug. 1995.

Crockett, et al., "A Method for Characterizing and Identifying Audio Based on Auditory Scene Analysis," Audio Engineering Society Convention Paper 6416, 118.sup.th Convention, Barcelona, May 28-31, 2005.

Crockett, Brett, "High Quality Multichannel Time Scaling and Pitch-Shifting using Auditory Scene Analysis," Audio Engineering Society Convention Paper 5948, New York, Oct. 2003.

Hauenstein M., "A Computationally Efficient Algorithm for Calculating Loudness Patterns of Narrowband Speech," Acoustics, Speech and Signal Processing 1997. 1997 IEEE International Conference, Munich Germany, Apr. 21-24, 1997, Los Alamitos, CA, USA, IEEE Comput. Soc., US, Apr. 21, 1997, pp. 1311-1314.

Cheng-Chieh Lee, "Diversity Control Among Multiple Coders: A Simple Approach to Multiple Descriptions," IEE, September.

Moore, et al., "A Model for the Prediction of Thresholds, Loudness and Partial Loudness," Journal of the Audio Engineering Society, Audio Engineering Society, New York, vol. 45, No. 4, Apr. 1997, pp. 224-240.

Glasberg, et al., "A Model of Loudness Applicable to Time-Varying Sounds," Journal of the Audio Engineering Society, Audio Engineering Society, New York, vol. 50, No. 5, May 2002, pp. 331-342.

Stevens, "Calculations of the Loudness of Complex Noise," Journal of the Acoustical Society of America, 1956.

Zwicker, "Psychological and Methodical Basis of Loudness," Acoustica, 1958.

Australian Broadcasting Authority (ABA), "Investigation into Loudness of Advertisements," Jul. 2002.

Zwicker, et al., "Psychoacoustics—Facts and Models," Springer-Verlag, Chapter 8, "Loudness," pp. 203-238, Berlin Heidelberg, 1990, 1999.

(56) References Cited

OTHER PUBLICATIONS

Lin, L., et al., "Auditory Filter Bank Design Using Masking Curves," 7.sup.th European Conference on Speech Communications and Technology, Sep. 2001.

ISO226 : 1987 (E), "Acoustics—Normal Equal Loudness Level Contours."

Seo, et al., "Auditory Model Design for Objective Audio Quality Measurement," Department of Electronic Engineering, Dongguk University, Seoul Korea.

Moulton, Dave, "Loud, Louder, Loudest!," Electronic Musician, Aug. 1, 2003.

Riedmiller, Jeff, "Working Toward Consistency in Progam Loudness," Broadcast Engineering, Jan. 1, 2004.

Robinson, et al., "Time-Domain Auditory Model for the Assessment of High-Quality Coded Audio," 107.sup.th AES Convention, Sep. 1999.

Hennesand, et al., "Sound Design—Creating the Sound for Complex Systems and Virtual Objects," Chapter II, "Anatomy and Psychoacoustics," 2003-2004.

Carroll, Tim, "Audio Metadata: You can get there from here", Oct. 11, 2004, pp. 1-4, XP002392570. http://tvtechnology.com/features/audio.sub.--notes/f-TC-metadata-08.21.02- .shtml.

Trapee, W., et al., "Key distribution for secure multimedia multicasts via data embedding," 2001 IEEE International Conferenced on Acoustics, Speech, and Signal Processing. May 7-11, 2001.

Bertsekas, Dimitri P., "Nonlinear Programming," 1995, Chapter 1.2 "Gradient Methods—Convergence," pp. 18-46.

Bertsekas, Dimitri P., "Nonlinear Programming," 1995, Chapter 1.8 "Nonderivative Methods,", pp. 142-148.

Li, M., et al., "Wavelet-based Nonlinear AGC Method for Hearing Aid Loudness Compensation" IEE Proc.-Vis. Image Signal Process., vol. 147, No. 6, Dec. 2000.

Wei, S., et al., "Realization of Dynamic Range Controllers on a Digital Signal Processor for Audio Systems" J. Acoust. Soc. Jpn. (E) 16, 6, 1995.

Blesser, Barry, "An Ultraminiature Console Compression System with Maximum User Flexibility" Journal of Audio Engineering Society, vol. 20, No. 4, May 1972, pp. 297-302, New York.

Hoeg, W. et al "Dynamic Range Control (DRC) and Music/Speech Control (MSC) Programme-Associated Data Services for DAB" EBU Review Technical, European Broadcasting Union, Brussels, BE, No. 261, Sep. 21, 1994, pp. 56-70.

\* cited by examiner

AUDIO GAIN CONTROL USING SPECIFIC-LOUDNESS-BASED AUDITORY EVENT DETECTION

CROSS REFERENCE TO RELATED APPLICATIONS

This application is a continuation of U.S. patent application Ser. No. 12/226,698 filed on Oct. 24, 2008, which is a national application of PCT application PCT/US2007/008313, which claims the benefit of the filing date of U.S. Provisional Patent Application Ser. No. 60/795,808 filed on Apr. 27, 2006, all of which are hereby incorporated by reference.

TECHNICAL FIELD

The present invention relates to audio dynamic range control methods and apparatus in which an audio processing device analyzes an audio signal and changes the level, gain or dynamic range of the audio, and all or some of the parameters of the audio gain and dynamics processing are generated as a function of auditory events. The invention also relates to computer programs for practicing such methods or controlling such apparatus.

The present invention also relates to methods and apparatus using a specific-loudness-based detection of auditory events. The invention also relates to computer programs for practicing such methods or controlling such apparatus.

BACKGROUND ART

Dynamics Processing of Audio

The techniques of automatic gain control (AGC) and dynamic range control (DRC) are well known and are a common element of many audio signal paths. In an abstract sense, both techniques measure the level of an audio signal in some manner and then gain-modify the signal by an amount that is a function of the measured level. In a linear, 1:1 dynamics processing system, the input audio is not processed and the output audio signal ideally matches the input audio signal. Additionally, if one has an audio dynamics processing system that automatically measures characteristics of the input signal and uses that measurement to control the output signal, if the input signal rises in level by 6 dB and the output signal is processed such that it only rises in level by 3 dB, then the output signal has been compressed by a ratio of 2:1 with respect to the input signal. International Publication Number WO 2006/047600 A1 ("Calculating and Adjusting the Perceived Loudness and/or the Perceived Spectral Balance of an Audio Signal" by Alan Jeffrey Seefeldt) provides a detailed overview of the five basic types of dynamics processing of audio: compression, limiting, automatic gain control (AGC), expansion and gating.

Auditory Events and Auditory Event Detection

The division of sounds into units or segments perceived as separate and distinct is sometimes referred to as "auditory event analysis" or "auditory scene analysis" ("ASA") and the segments are sometimes referred to as "auditory events" or "audio events." An extensive discussion of auditory scene analysis is set forth by Albert S. Bregman in his book *Auditory Scene Analysis—The Perceptual Organization of Sound*, Massachusetts Institute of Technology, 1991, Fourth printing, 2001, Second MIT Press paperback edition). In addition, U.S. Pat. No. 6,002,776 to Bhadkamkar, et al, Dec. 14, 1999 cites publications dating back to 1976 as "prior art work related to sound separation by auditory scene analysis." However, the Bhadkamkar, et al patent discourages the practical use of auditory scene analysis, concluding that "[t]echniques involving auditory scene analysis, although interesting from a scientific point of view as models of human auditory processing, are currently far too computationally demanding and specialized to be considered practical techniques for sound separation until fundamental progress is made."

A useful way to identify auditory events is set forth by Crockett and Crocket et al in various patent applications and papers listed below under the heading "Incorporation by Reference." According to those documents, an audio signal is divided into auditory events, each of which tends to be perceived as separate and distinct, by detecting changes in spectral composition (amplitude as a function of frequency) with respect to time. This may be done, for example, by calculating the spectral content of successive time blocks of the audio signal, calculating the difference in spectral content between successive time blocks of the audio signal, and identifying an auditory event boundary as the boundary between successive time blocks when the difference in the spectral content between such successive time blocks exceeds a threshold. Alternatively, changes in amplitude with respect to time may be calculated instead of or in addition to changes in spectral composition with respect to time.

In its least computationally demanding implementation, the process divides audio into time segments by analyzing the entire frequency band (full bandwidth audio) or substantially the entire frequency band (in practical implementations, band limiting filtering at the ends of the spectrum is often employed) and giving the greatest weight to the loudest audio signal components. This approach takes advantage of a psychoacoustic phenomenon in which at smaller time scales (20 milliseconds (ms) and less) the ear may tend to focus on a single auditory event at a given time. This implies that while multiple events may be occurring at the same time, one component tends to be perceptually most prominent and may be processed individually as though it were the only event taking place. Taking advantage of this effect also allows the auditory event detection to scale with the complexity of the audio being processed. For example, if the input audio signal being processed is a solo instrument, the audio events that are identified will likely be the individual notes being played. Similarly for an input voice signal, the individual components of speech, the vowels and consonants for example, will likely be identified as individual audio elements. As the complexity of the audio increases, such as music with a drumbeat or multiple instruments and voice, the auditory event detection identifies the "most prominent" (i.e., the loudest) audio element at any given moment.

At the expense of greater computational complexity, the process may also take into consideration changes in spectral composition with respect to time in discrete frequency subbands (fixed or dynamically determined or both fixed and dynamically determined subbands) rather than the full bandwidth. This alternative approach takes into account more than one audio stream in different frequency subbands rather than assuming that only a single stream is perceptible at a particular time.

Auditory event detection may be implemented by dividing a time domain audio waveform into time intervals or blocks and then converting the data in each block to the frequency domain, using either a filter bank or a time-frequency transformation, such as the FFT. The amplitude of the spectral content of each block may be normalized in order to eliminate or reduce the effect of amplitude changes. Each resulting frequency domain representation provides an indication of the spectral content of the audio in the particular block. The spectral content of successive blocks is compared and changes greater than a threshold may be taken to indicate the temporal start or temporal end of an auditory event.

Preferably, the frequency domain data is normalized, as is described below. The degree to which the frequency domain data needs to be normalized gives an indication of amplitude. Hence, if a change in this degree exceeds a predetermined threshold that too may be taken to indicate an event boundary. Event start and end points resulting from spectral changes and from amplitude changes may be ORed together so that event boundaries resulting from either type of change are identified.

Although techniques described in said Crockett and Crockett at al applications and papers are particularly useful in connection with aspects of the present invention, other techniques for identifying auditory events and event boundaries may be employed in aspects of the present invention.

DISCLOSURE OF THE INVENTION

Conventional prior-art dynamics processing of audio involves multiplying the audio by a time-varying control signal that adjusts the gain of the audio producing a desired result. "Gain" is a scaling factor that scales the audio amplitude. This control signal may be generated on a continuous basis or from blocks of audio data, but it is generally derived by some form of measurement of the audio being processed, and its rate of change is determined by smoothing filters, sometimes with fixed characteristics and sometimes with characteristics that vary with the dynamics of the audio. For example, response times may be adjustable in accordance with changes in the magnitude or the power of the audio. Prior art methods such as automatic gain control (AGC) and dynamic range compression (DRC) do not assess in any psychoacoustically-based way the time intervals during which gain changes may be perceived as impairments and when they can be applied without imparting audible artifacts. Therefore, conventional audio dynamics processes can often introduce audible artifacts, i.e., the effects of the dynamics processing can introduce unwanted perceptible changes in the audio.

Auditory scene analysis identifies perceptually discrete auditory events, with each event occurring between two consecutive auditory event boundaries. The audible impairments caused by a gain change can be greatly reduced by ensuring that within an auditory event the gain is more nearly constant and by confining much of the change to the neighborhood of an event boundary. In the context of compressors or expanders, the response to an increase in audio level (often called the attack) may be rapid, comparable with or shorter than the minimum duration of auditory events, but the response to a decrease (the release or recovery) may be slower so that sounds that ought to appear constant or to decay gradually may be audibly disturbed. Under such circumstances, it is very beneficial to delay the gain recovery until the next boundary or to slow down the rate of change of gain during an event. For automatic gain control applications, where the medium- to long-term level or loudness of the audio is normalized and both attack and release times may therefore be long compared with the minimum duration of an auditory event, it is beneficial during events to delay changes or slow down rates of change in gain until the next event boundary for both increasing and decreasing gains.

According to one aspect of the present invention, an audio processing system receives an audio signal and analyzes and alters the gain and/or dynamic range characteristics of the audio. The dynamic range modification of the audio is often controlled by parameters of a dynamics processing system (attack and release time, compression ratio, etc.) that have significant effects on the perceptual artifacts introduced by the dynamics processing. Changes in signal characteristics with respect to time in the audio signal are detected and identified as auditory event boundaries, such that an audio segment between consecutive boundaries constitutes an auditory event in the audio signal. The characteristics of the auditory events of interest may include characteristics of the events such as perceptual strength or duration. Some of said one or more dynamics processing parameters are generated at least partly in response to auditory events and/or the degree of change in signal characteristics associated with said auditory event boundaries.

Typically, an auditory event is a segment of audio that tends to be perceived as separate and distinct. One usable measure of signal characteristics includes a measure of the spectral content of the audio, for example, as described in the cited Crockett and Crockett et al documents. All or some of the one or more audio dynamics processing parameters may be generated at least partly in response to the presence or absence and characteristics of one or more auditory events. An auditory event boundary may be identified as a change in signal characteristics with respect to time that exceeds a threshold. Alternatively, all or some of the one or more parameters may be generated at least partly in response to a continuing measure of the degree of change in signal characteristics associated with said auditory event boundaries. Although, in principle, aspects of the invention may be implemented in analog and/or digital domains, practical implementations are likely to be implemented in the digital domain in which each of the audio signals are represented by individual samples or samples within blocks of data. In this case, the signal characteristics may be the spectral content of audio within a block, the detection of changes in signal characteristics with respect to time may be the detection of changes in spectral content of audio from block to block, and auditory event temporal start and stop boundaries each coincide with a boundary of a block of data. It should be noted that for the more traditional case of performing dynamic gain changes on a sample-by-sample basis, that the auditory scene analysis described could be performed on a block basis and the resulting auditory event information being used to perform dynamic gain changes that are applied sample-by-sample.

By controlling key audio dynamics processing parameters using the results of auditory scene analysis, a dramatic reduction of audible artifacts introduced by dynamics processing may be achieved.

The present invention presents two ways of performing auditory scene analysis. The first performs spectral analysis and identifies the location of perceptible audio events that are used to control the dynamic gain parameters by identifying changes in spectral content. The second way transforms the audio into a perceptual loudness domain (that may provide more psychoacoustically relevant information than the first way) and identifies the location of auditory events that are subsequently used to control the dynamic gain parameters. It should be noted that the second way requires that the audio processing be aware of absolute acoustic reproduction levels, which may not be possible in some implementations. Presenting both methods of auditory scene analysis allows implementations of ASA-controlled dynamic gain modification using processes or devices that may or may not be calibrated to take into account absolute reproduction levels.

Aspects of the present invention are described herein in an audio dynamics processing environment that includes aspects of other inventions. Such other inventions are described in various pending United States and International Patent Applications of Dolby Laboratories Licensing Corporation, the owner of the present application, which applications are identified herein.

BEST MODE FOR CARRYING OUT THE INVENTION

Auditory Scene Analysis (Original, Non-Loudness Domain Method)

Figure 1:
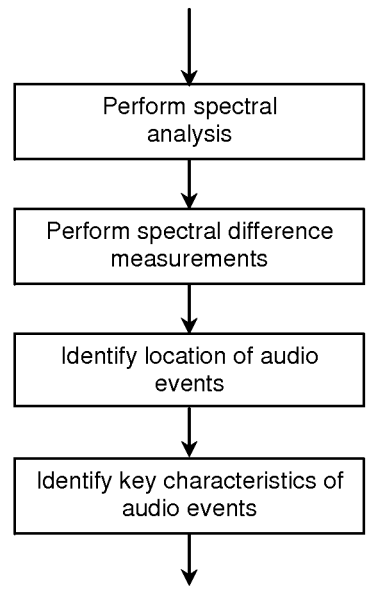
FIG. 1 is a flow chart showing an example of processing steps for performing auditory scene analysis.

In accordance with an embodiment of one aspect of the present invention, auditory scene analysis may be composed of four general processing steps as shown in a portion of FIG. 1. The first step 1-1 ("Perform Spectral Analysis") takes a time-domain audio signal, divides it into blocks and calculates a spectral profile or spectral content for each of the blocks. Spectral analysis transforms the audio signal into the short-term frequency domain. This may be performed using any filterbank, either based on transforms or banks of bandpass filters, and in either linear or warped frequency space (such as the Bark scale or critical band, which better approximate the characteristics of the human ear). With any filterbank there exists a tradeoff between time and frequency. Greater time resolution, and hence shorter time intervals, leads to lower frequency resolution. Greater frequency resolution, and hence narrower subbands, leads to longer time intervals.

The first step, illustrated conceptually in FIG. 1 calculates the spectral content of successive time segments of the audio signal. In a practical embodiment, the ASA block size may be from any number of samples of the input audio signal, although 512 samples provide a good tradeoff of time and frequency resolution. In the second step 1-2, the differences in spectral content from block to block are determined ("Perform spectral profile difference measurements"). Thus, the second step calculates the difference in spectral content between successive time segments of the audio signal. As discussed above, a powerful indicator of the beginning or end of a perceived auditory event is believed to be a change in spectral content. In the third step 1-3 ("Identify location of auditory event boundaries"), when the spectral difference between one spectral-profile block and the next is greater than a threshold, the block boundary is taken to be an auditory event boundary. The audio segment between consecutive boundaries constitutes an auditory event. Thus, the third step sets an auditory event boundary between successive time segments when the difference in the spectral profile content between such successive time segments exceeds a threshold, thus defining auditory events. In this embodiment, auditory event boundaries define auditory events having a length that is an integral multiple of spectral profile blocks with a minimum length of one spectral profile block (512 samples in this example). In principle, event boundaries need not be so limited. As an alternative to the practical embodiments discussed herein, the input block size may vary, for example, so as to be essentially the size of an auditory event.

Following the identification of the event boundaries, key characteristics of the auditory event are identified, as shown in step 1-4.

Figure 2:
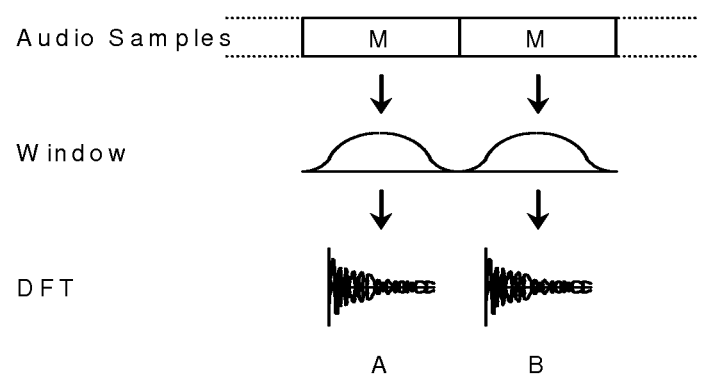
FIG. 2 shows an example of block processing, windowing and performing the DFT on audio while performing the auditory scene analysis.

Either overlapping or non-overlapping segments of the audio may be windowed and used to compute spectral profiles of the input audio. Overlap results in finer resolution as to the location of auditory events and, also, makes it less likely to miss an event, such as a short transient. However, overlap also increases computational complexity. Thus, overlap may be omitted. FIG. 2 shows a conceptual representation of non-overlapping N sample blocks being windowed and transformed into the frequency domain by the Discrete Fourier Transform (DFT). Each block may be windowed and transformed into the frequency domain, such as by using the DFT, preferably implemented as a Fast Fourier Transform (FFT) for speed.

The following variables may be used to compute the spectral profile of the input block:
 M=number of windowed samples in a block used to compute spectral profile
 P=number of samples of spectral computation overlap
In general, any integer numbers may be used for the variables above. However, the implementation will be more efficient if M is set equal to a power of 2 so that standard FFTs may be used for the spectral profile calculations. In a practical embodiment of the auditory scene analysis process, the parameters listed may be set to:

M=512 samples (or 11.6 ms at 44.1 kHz)
P=0 samples (no overlap)

The above-listed values were determined experimentally and were found generally to identify with sufficient accuracy the location and duration of auditory events. However, setting the value of P to 256 samples (50% overlap) rather than zero samples (no overlap) has been found to be useful in identifying some hard-to-find events. While many different types of windows may be used to minimize spectral artifacts due to windowing, the window used in the spectral profile calculations is an M-point Hanning, Kaiser-Bessel or other suitable, preferably non-rectangular, window. The above-indicated values and a Hanning window type were selected after extensive experimental analysis as they have shown to provide excellent results across a wide range of audio material. Non-rectangular windowing is preferred for the processing of audio signals with predominantly low frequency content. Rectangular windowing produces spectral artifacts that may cause incorrect detection of events. Unlike certain encoder/decoder (codec) applications where an overall overlap/add process must provide a constant level, such a constraint does not apply here and the window may be chosen for characteristics such as its time/frequency resolution and stop-band rejection.

In step 1-1 (FIG. 1), the spectrum of each M-sample block may be computed by windowing the data with an M-point Hanning, Kaiser-Bessel or other suitable window, converting to the frequency domain using an M-point Fast Fourier Transform, and calculating the magnitude of the complex FFT coefficients. The resultant data is normalized so that the largest magnitude is set to unity, and the normalized array of M numbers is converted to the log domain. The data may also be normalized by some other metric such as the mean magnitude value or mean power value of the data. The array need not be converted to the log domain, but the conversion simplifies the calculation of the difference measure in step 1-2. Furthermore, the log domain more closely matches the nature of the human auditory system. The resulting log domain values have a range of minus infinity to zero. In a practical embodiment, a lower limit may be imposed on the range of values; the limit may be fixed, for example −60 dB, or be frequency-dependent to reflect the lower audibility of quiet sounds at low and very high frequencies. (Note that it would be possible to reduce the size of the array to M/2 in that the FFT represents negative as well as positive frequencies).

Step 1-2 calculates a measure of the difference between the spectra of adjacent blocks. For each block, each of the M (log) spectral coefficients from step 1-1 is subtracted from the corresponding coefficient for the preceding block, and the magnitude of the difference calculated (the sign is ignored). These M differences are then summed to one number. This difference measure may also be expressed as an average difference per spectral coefficient by dividing the difference measure by the number of spectral coefficients used in the sum (in this case M coefficients).

Step 1-3 identifies the locations of auditory event boundaries by applying a threshold to the array of difference measures from step 1-2 with a threshold value. When a difference measure exceeds a threshold, the change in spectrum is deemed sufficient to signal a new event and the block number of the change is recorded as an event boundary. For the values of M and P given above and for log domain values (in step 1-1) expressed in units of dB, the threshold may be set equal to 2500 if the whole magnitude FFT (including the mirrored part) is compared or 1250 if half the FFT is compared (as noted above, the FFT represents negative as well as positive frequencies—for the magnitude of the FFT, one is the mirror image of the other). This value was chosen experimentally and it provides good auditory event boundary detection. This parameter value may be changed to reduce (increase the threshold) or increase (decrease the threshold) the detection of events.

Figure 3:
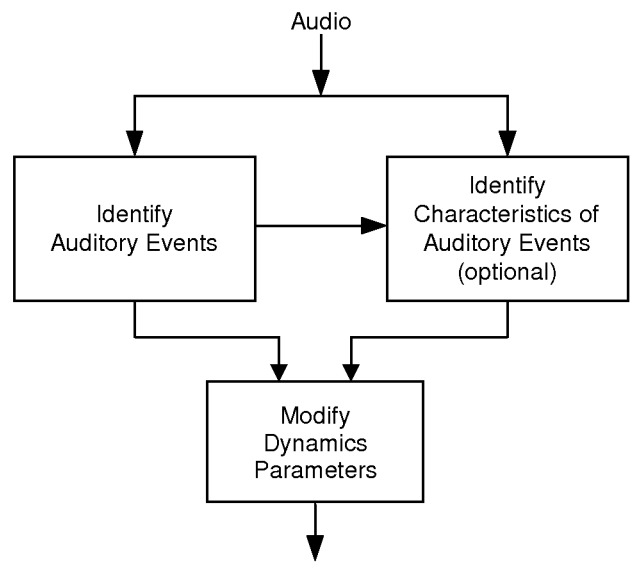
FIG. 3 is in the nature of a flow chart or functional block diagram, showing parallel processing in which audio is used to identify auditory events and to identify the characteristics of the auditory events such that the events and their characteristics are used to modify dynamics processing parameters.
Figure 4:
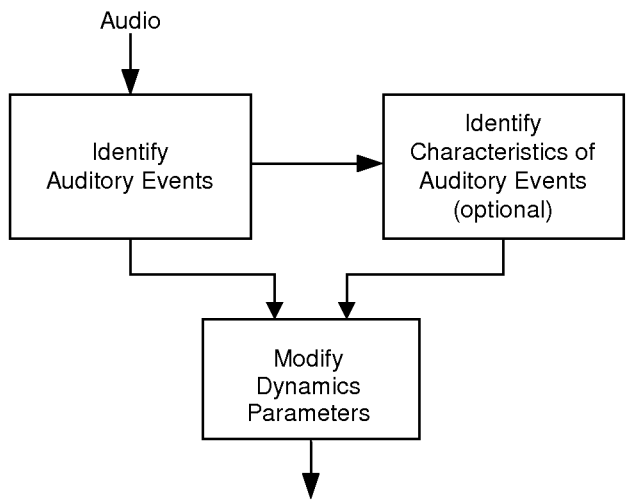
FIG. 4 is in the nature of a flow chart or functional block diagram, showing processing in which audio is used only to identify auditory events and the event characteristics are determined from the audio event detection such that the events and their characteristics are used to modify the dynamics processing parameters.
Figure 5:
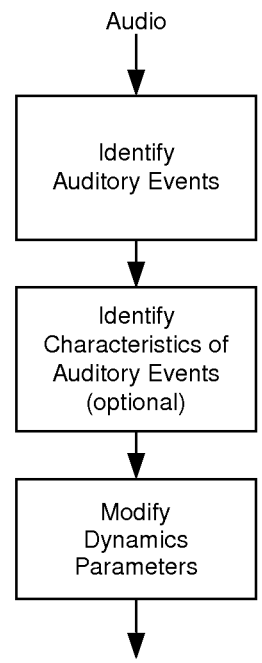
FIG. 5 is in the nature of a flow chart or functional block diagram, showing processing in which audio is used only to identify auditory events and the event characteristics are determined from the audio event detection and such that only the characteristics of the auditory events are used to modify the dynamics processing parameters.

The process of FIG. 1 may be represented more generally by the equivalent arrangements of FIGS. 3, 4 and 5. In FIG. 3, an audio signal is applied in parallel to an "Identify Auditory Events" function or step 3-1 that divides the audio signal into auditory events, each of which tends to be perceived as separate and distinct and to an optional "Identify Characteristics of Auditory Events" function or step 3-2. The process of FIG. 1 may be employed to divide the audio signal into auditory events and their characteristics identified or some other suitable process may be employed. The auditory event information, which may be an identification of auditory event boundaries, determined by function or step 3-1 is then used to modify the audio dynamics processing parameters (such as attack, release, ratio, etc.), as desired, by a "Modify Dynamics Parameters" function or step 3-3. The optional "Identify Characteristics" function or step 3-3 also receives the auditory event information. The "Identify Characteristics" function or step 3-3 may characterize some or all of the auditory events by one or more characteristics. Such characteristics may include an identification of the dominant subband of the auditory event, as described in connection with the process of FIG. 1. The characteristics may also include one or more audio characteristics, including, for example, a measure of power of the auditory event, a measure of amplitude of the auditory event, a measure of the spectral flatness of the auditory event, and whether the auditory event is substantially silent, or other characteristics that help modify dynamics parameters such that negative audible artifacts of the processing are reduced or removed. The characteristics may also include other characteristics such as whether the auditory event includes a transient.

Alternatives to the arrangement of FIG. 3 are shown in FIGS. 4 and 5. In FIG. 4, the audio input signal is not applied directly to the "Identify Characteristics" function or step 4-3, but it does receive information from the "Identify Auditory Events" function or step 4-1. The arrangement of FIG. 1 is a specific example of such an arrangement. In FIG. 5, the functions or steps 5-1, 5-2 and 5-3 are arranged in series.

The details of this practical embodiment are not critical. Other ways to calculate the spectral content of successive time segments of the audio signal, calculate the differences between successive time segments, and set auditory event boundaries at the respective boundaries between successive time segments when the difference in the spectral profile content between such successive time segments exceeds a threshold may be employed.

Auditory Scene Analysis (New, Loudness Domain Method)

Figure 6:
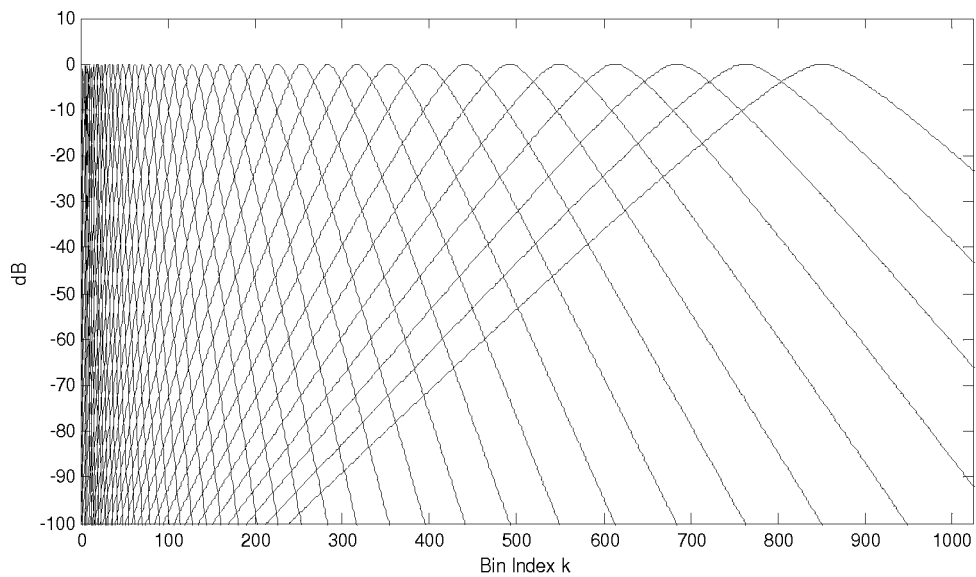
FIG. 6 shows a set idealized auditory filter characteristic responses that approximate critical banding on the ERB scale. The horizontal scale is frequency in Hertz and the vertical scale is level in decibels.

International application under the Patent Cooperation Treaty S.N. PCT/US2005/038579, filed Oct. 25, 2005, published as International Publication Number WO 2006/047600 A1, entitled "Calculating and Adjusting the Perceived Loudness and/or the Perceived Spectral Balance of an Audio Signal" by Alan Jeffrey Seefeldt discloses, among other things, an objective measure of perceived loudness based on a psychoacoustic model. Said application is hereby incorporated by reference in its entirety. As described in said application, from an audio signal, x[n], an excitation signal E[b,t] is computed that approximates the distribution of energy along the basilar membrane of the inner ear at critical band b during time block t. This excitation may be computed from the Short-time Discrete Fourier Transform (STDFT) of the audio signal as follows:

$$E[b, t] = \lambda_b E[b, t-1] + (1-\lambda_b)\sum_k |T[k]|^2 |C_b[k]|^2 |X[k, t]|^2 \quad (1)$$

where X[k,t] represents the STDFT of x[n] at time block t and bin k. Note that in equation 1 t represents time in discrete units of transform blocks as opposed to a continuous measure, such as seconds. T[k] represents the frequency response of a filter simulating the transmission of audio through the outer and middle ear, and $C_b[k]$ represents the frequency response of the basilar membrane at a location corresponding to critical band b. FIG. 6 depicts a suitable set of critical band filter responses in which 40 bands are spaced uniformly along the Equivalent Rectangular Bandwidth (ERB) scale, as defined by Moore and Glasberg. Each filter shape is described by a rounded exponential function and the bands are distributed using a spacing of 1 ERB. Lastly, the smoothing time constant $\lambda_b$ in equation 1 may be advantageously chosen proportionate to the integration time of human loudness perception within band b.

Figure 7:
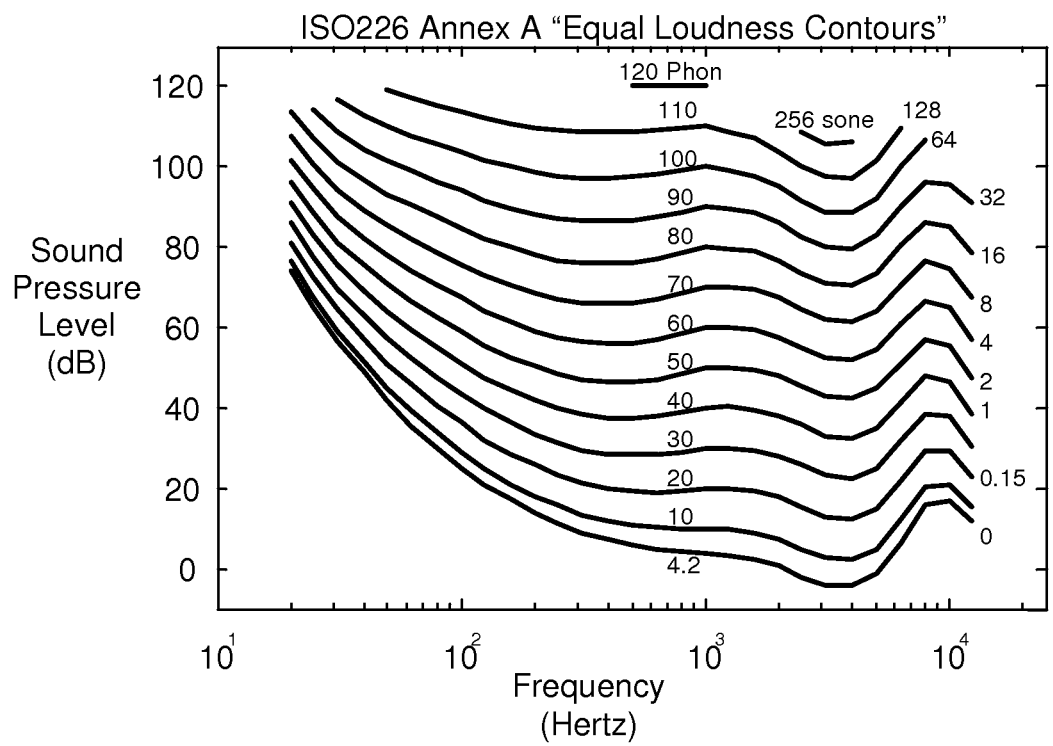
FIG. 7 shows the equal loudness contours of ISO 226. The horizontal scale is frequency in Hertz (logarithmic base 10 scale) and the vertical scale is sound pressure level in decibels.

Using equal loudness contours, such as those depicted in FIG. 7, the excitation at each band is transformed into an excitation level that would generate the same perceived loudness at 1 kHz. Specific loudness, a measure of perceptual loudness distributed across frequency and time, is then computed from the transformed excitation, $E_{1kHz}[b,t]$, through a compressive non-linearity. One such suitable function to compute the specific loudness N[b,t] is given by:

$$N[b, t] = \beta\left(\left(\frac{E_{1kHz}[b, t]}{TQ_{1kHz}}\right)^\alpha - 1\right) \quad (2)$$

where $TQ_{1kHz}$ is the threshold in quiet at 1 kHz and the constants β and α are chosen to match growth of loudness data as collected from listening experiments. Abstractly, this transformation from excitation to specific loudness may be presented by the function Ψ{ } such that:

$$N[b,t]=\Psi\{E[b,t]\}$$

Finally, the total loudness, L[t], represented in units of sone, is computed by summing the specific loudness across bands:

$$L[t] = \sum_b N[b, t] \quad (3)$$

The specific loudness N[b,t] is a spectral representation meant to simulate the manner in which a human perceives audio as a function of frequency and time. It captures variations in sensitivity to different frequencies, variations in sensitivity to level, and variations in frequency resolution. As such, it is a spectral representation well matched to the detection of auditory events. Though more computationally complex, comparing the difference of N[b,t] across bands between successive time blocks may in many cases result in more perceptually accurate detection of auditory events in comparison to the direct use of successive FFT spectra described above.

In said patent application, several applications for modifying the audio based on this psychoacoustic loudness model are disclosed. Among these are several dynamics processing algorithms, such as AGC and DRC. These disclosed algorithms may benefit from the use of auditory events to control various associated parameters. Because specific loudness is already computed, it is readily available for the purpose of detecting said events. Details of a preferred embodiment are discussed below.

Audio Dynamics Processing Parameter Control with Auditory Events

Two examples of embodiments of the invention are now presented. The first describes the use of auditory events to control the release time in a digital implementation of a Dynamic Range Controller (DRC) in which the gain control is derived from the Root Mean Square (RMS) power of the signal. The second embodiment describes the use of auditory events to control certain aspects of a more sophisticated combination of AGC and DRC implemented within the context of the psychoacoustic loudness model described above. These two embodiments are meant to serve as examples of the invention only, and it should be understood that the use of auditory events to control parameters of a dynamics processing algorithm is not restricted to the specifics described below.

Dynamic Range Control

The described digital implementation of a DRC segments an audio signal x[n] into windowed, half-overlapping blocks, and for each block a modification gain based on a measure of the signal's local power and a selected compression curve is computed. The gain is smoothed across blocks and then multiplied with each block. The modified blocks are finally overlap-added to generate the modified audio signal y[n].

It should be noted, that while the auditory scene analysis and digital implementation of DRC as described here divides the time-domain audio signal into blocks to perform analysis and processing, the DRC processing need not be performed using block segmentation. For example the auditory scene analysis could be performed using block segmentation and spectral analysis as described above and the resulting auditory event locations and characteristics could be used to provide control information to a digital implementation of a traditional DRC implementation that typically operates on a sample-by-sample basis. Here, however, the same blocking structure used for auditory scene analysis is employed for the DRC to simplify the description of their combination.

Proceeding with the description of a block based DRC implementation, the overlapping blocks of the audio signal may be represented as:

$$x[n,t]=w[n]x[n+tM/2] \text{ for } 0 \leq n \leq M-1 \quad (4)$$

where M is the block length and the hopsize is M/2, w[n] is the window, n is the sample index within the block, and t is the block index (note that here t is used in the same way as with the STDFT in equation 1; it represents time in discrete units of blocks rather than seconds, for example). Ideally, the window w[n] tapers to zero at both ends and sums to unity when half-overlapped with itself; the commonly used sine window meets these criteria, for example.

For each block, one may then compute the RMS power to generate a power measure P[t] in dB per block:

$$P[t] = 10 * \log 10 \left( \frac{1}{M} \sum_{n=1}^{M} x^2[n, t] \right) \quad (5)$$

Figure 8:
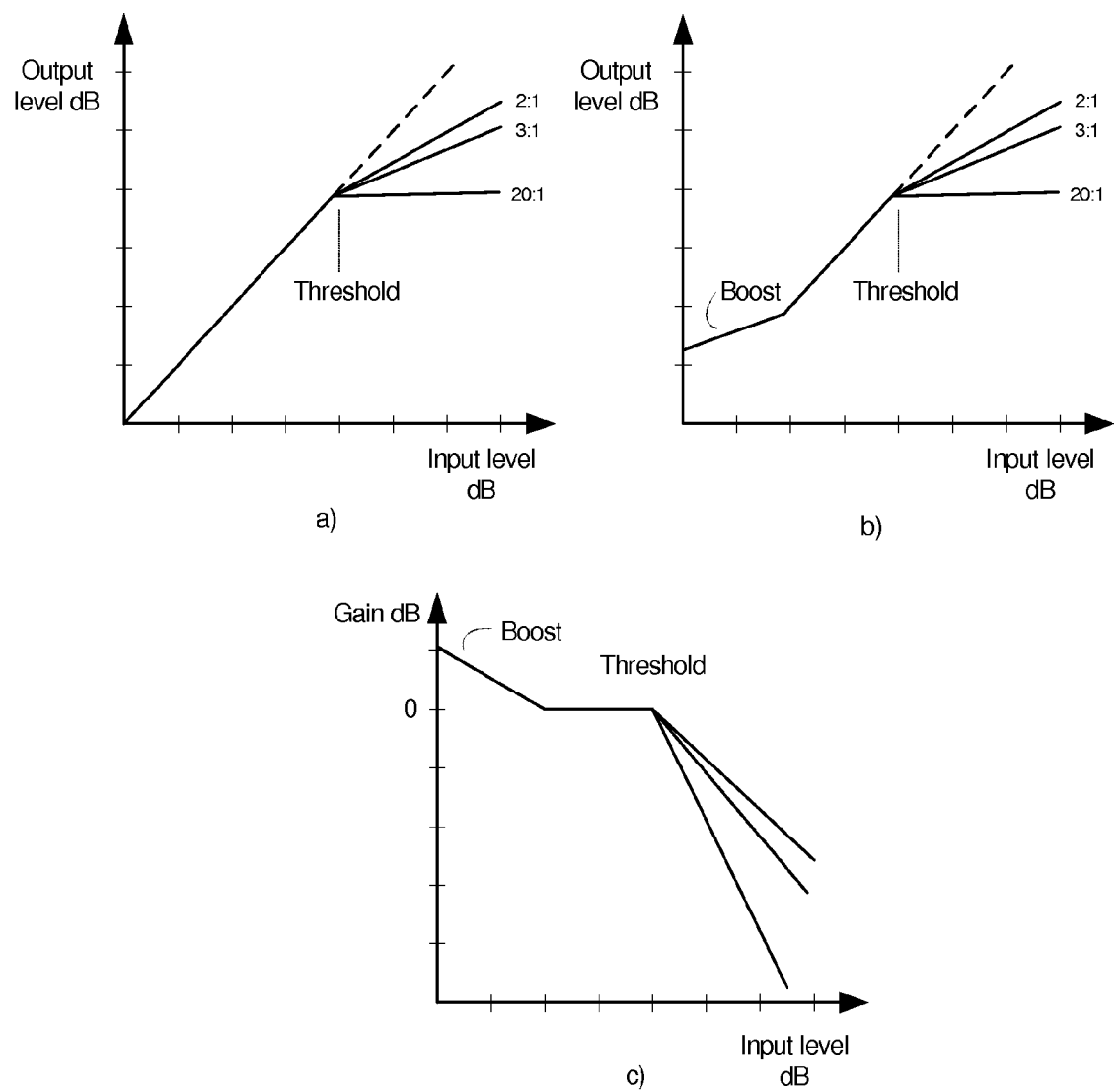
FIGS. 8a-c shows idealized input/output characteristics and input gain characteristics of an audio dynamic range compressor.

As mentioned earlier, one could smooth this power measure with a fast attack and slow release prior to processing with a compression curve, but as an alternative the instantaneous power P[t] is processed and the resulting gain is smoothed. This alternate approach has the advantage that a simple compression curve with sharp knee points may be used, but the resulting gains are still smooth as the power travels through the knee-point. Representing a compression curve as shown in FIG. 8c as a function F of signal level that generates a gain, the block gain G[t] is given by:

$$G[t]=F\{P[t]\} \quad (6)$$

Assuming that the compression curve applies greater attenuation as signal level increases, the gain will be decreasing when the signal is in "attack mode" and increasing when in "release mode". Therefore, a smoothed gain $\overline{G}[t]$ may be computed according to:

$$\overline{G}[t] = \alpha[t] \cdot \overline{G}[t-1] + (1 - \alpha[t])G[t] \quad (7a)$$

where $$\alpha[t] = \begin{cases} \alpha_{attack} & G[t] < \overline{G}[t-1] \\ \alpha_{release} & G[t] \geq \overline{G}[t-1]. \end{cases} \quad (7b)$$

and $$\alpha_{release} \gg \alpha_{attack} \quad (7c)$$

Finally, the smoothed gain $\overline{G}[t]$, which is in dB, is applied to each block of the signal, and the modified blocks are overlap-added to produce the modified audio:

$$y[n+tM/2]=(10^{\overline{G}[t]/20})x[n,t]+(10^{\overline{G}[t-1]/20})x[n+M/2,t-1]$$
for $0 < n < M/2$ (8)

Note that because the blocks have been multiplied with a tapered window, as shown in equation 4, the overlap-add synthesis shown above effectively smooths the gains across samples of the processed signal y[n]. Thus, the gain control signal receives smoothing in addition to that in shown in equation 7a. In a more traditional implementation of DRC operating sample-by-sample rather than block-by-block, gain smoothing more sophisticated than the simple one-pole filter shown in equation 7a might be necessary in order to prevent audible distortion in the processed signal. Also, the use of block based processing introduces an inherent delay of M/2 samples into the system, and as long as the decay time associated with $\alpha_{attack}$ is close to this delay, the signal x[n] does not need to be delayed further before the application of the gains for the purposes of preventing overshoot.

FIGS. 9a through 9c depict the result of applying the described DRC processing to an audio signal. For this particular implementation, a block length of M=512 is used at a sampling rate of 44.1 kHz. A compression curve similar to the one shown in FIG. 8b is used:
above −20 dB relative to full scale digital the signal is attenuated with a ratio of 5:1, and below
−30 dB the signal is boosted with a ratio of 5:1. The gain is smoothed with an attack coefficient $\alpha_{attack}$ corresponding to a half-decay time of 10 ms and a release coefficient $\alpha_{release}$ corresponding to a half-decay time of 500 ms. The original audio signal depicted in FIG. 9a consists of six consecutive piano chords, with the final chord, located around sample $1.75 \times 10^5$, decaying into silence. Examining a plot of the gain $\overline{G}[t]$ in FIG. 9b, it should be noted that the gain remains close to 0 dB while the six chords are played. This is because the signal energy remains, for the most part, between −30 dB and −20 dB, the region within which the DRC curve calls for no modification. However, after the hit of the last chord, the signal energy falls below −30 dB, and the gain begins to rise, eventually beyond 15 dB, as the chord decays. FIG. 9c depicts the resulting modified audio signal, and one can see that the tail of the final chord is boosted significantly. Audibly, this boosting of the chord's natural, low-level decay sound creates an extremely unnatural result. It is the aim of the present invention to prevent problems of this type that are associated with a traditional dynamics processor.

Figure 10:
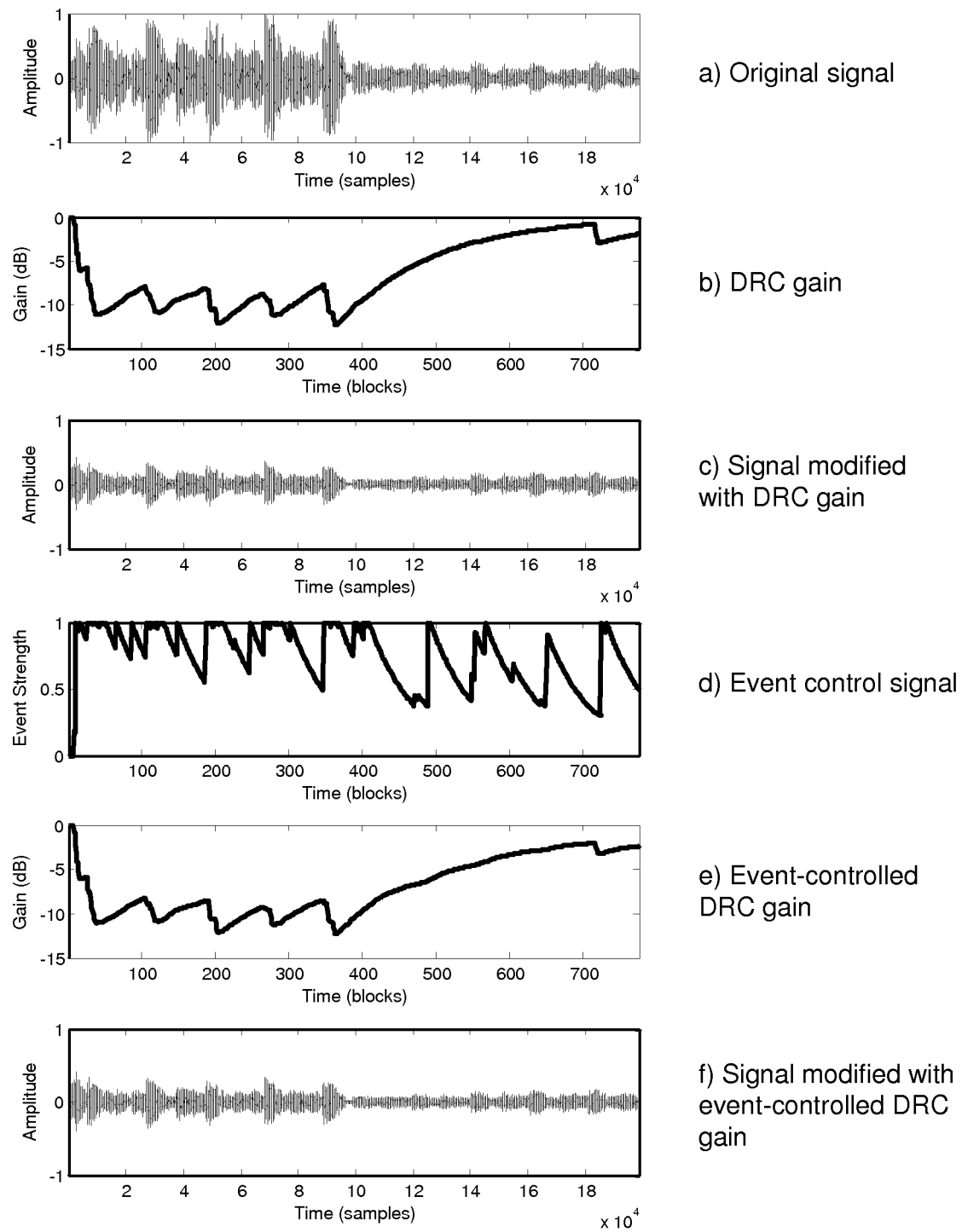
FIGS. 10a-f show an example of the use of auditory events to control the release time in a digital implementation of a traditional Dynamic Range Controller (DRC) in which the gain control is derived from the Root Mean Square (RMS) power of the signal for an alternate signal to that used in FIG. 9.

FIGS. 10a through 10c depict the results of applying the exact same DRC system to a different audio signal. In this case the first half of the signal consists of an up-tempo music piece at a high level, and then at approximately sample $10 \times 10^4$ the signal switches to a second up-tempo music piece, but at a significantly lower level. Examining the gain in FIG. 6b, one sees that the signal is attenuated by approximately 10 dB during the first half, and then the gain rises back up to 0 dB during the second half when the softer piece is playing. In this case, the gain behaves as desired. One would like the second piece to be boosted relative to the first, and the gain should increase quickly after the transition to the second piece to be audibly unobtrusive. One sees a gain behavior that is similar to that for the first signal discussed, but here the behavior is desirable. Therefore, one would like to fix the first case without affecting the second. The use of auditory events to control the release time of this DRC system provides such a solution.

Figure 9:
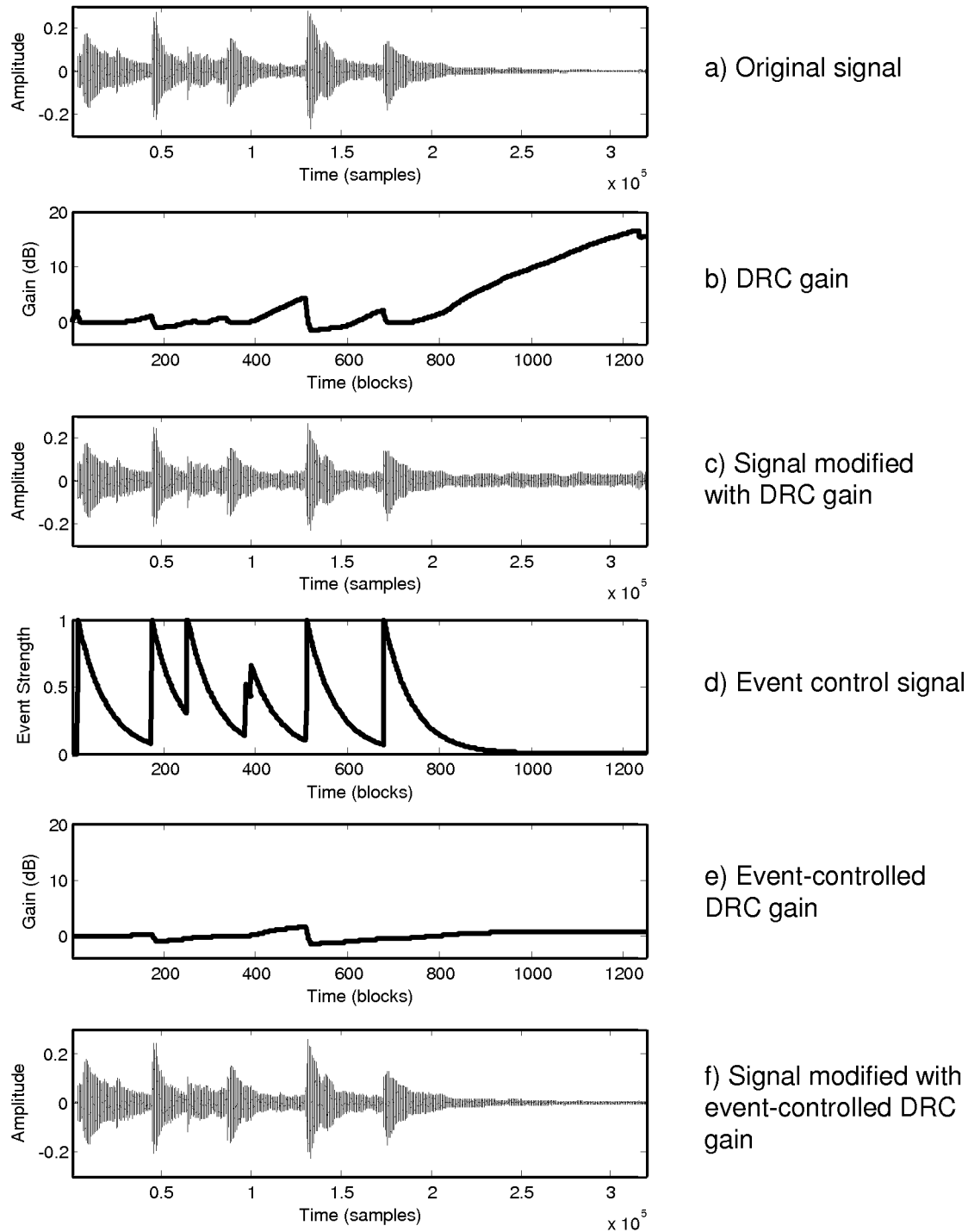
FIGS. 9a-f show an example of the use of auditory events to control the release time in a digital implementation of a traditional Dynamic Range Controller (DRC) in which the gain control is derived from the Root Mean Square (RMS) power of the signal.

In the first signal that was examined in FIG. 9, the boosting of the last chord's decay seems unnatural because the chord and its decay are perceived as a single auditory event whose integrity is expected to be maintained. In the second case, however, many auditory events occur while the gain increases, meaning that for any individual event, little change is imparted. Therefore the overall gain change is not as objectionable. One may therefore argue that a gain change should be allowed only in the near temporal vicinity of an auditory event boundary. One could apply this principal to the gain while it is in either attack or release mode, but for most practical implementations of a DRC, the gain moves so quickly in attack mode in comparison to the human temporal resolution of event perception that no control is necessary. One may therefore use events to control smoothing of the DRC gain only when it is in release mode.

A suitable behavior of the release control is now described. In qualitative terms, if an event is detected, the gain is smoothed with the release time constant as specified above in Equation 7a. As time evolves past the detected event, and if no subsequent events are detected, the release time constant continually increases so that eventually the smoothed gain is "frozen" in place. If another event is detected, then the smoothing time constant is reset to the original value and the process repeats. In order to modulate the release time, one may first generate a control signal based on the detected event boundaries.

As discussed earlier, event boundaries may be detected by looking for changes in successive spectra of the audio signal. In this particular implementation, the DFT of each overlapping block x[n,t] may be computed to generate the STDFT of the audio signal x[n]:

$$X[k, t] = \sum_{n=0}^{M-1} x[n, t] e^{-j\frac{2\pi k n}{M}} \qquad (9)$$

Next, the difference between the normalized log magnitude spectra of successive blocks may be computed according to:

$$D[t] = \sum_k |X_{NORM}[k, t] - X_{NORM}[k, t-1]| \qquad (10a)$$

where $$X_{NORM}[k, t] = \log\left(\frac{|X[k, t]|}{\max_k\{|X[k, t]|\}}\right) \qquad (10b)$$

Here the maximum of |X[k,t]| across bins k is used for normalization, although one might employ other normalization factors; for example, the average of |X[k,t]| across bins. If the difference D[t] exceeds a threshold $D_{min}$, then an event is considered to have occurred. Additionally, one may assign a strength to this event, lying between zero and one, based on the size of D[t] in comparison to a maximum threshold $D_{max}$. The resulting auditory event strength signal A[t] may be computed as:

$$A[t] = \begin{cases} 0 & D[t] \leq D_{min} \\ \frac{D[t] - D_{min}}{D_{max} - D_{min}} & D_{min} < D[t] < D_{max} \\ 1 & D[t] \geq D_{max} \end{cases} \qquad (11)$$

By assigning a strength to the auditory event proportional to the amount of spectral change associated with that event, greater control over the dynamics processing is achieved in comparison to a binary event decision. The inventors have found that larger gain changes are acceptable during stronger events, and the signal in equation 11 allows such variable control.

The signal A[t] is an impulsive signal with an impulse occurring at the location of an event boundary. For the purposes of controlling the release time, one may further smooth the signal A[t] so that it decays smoothly to zero after the detection of an event boundary. The smoothed event control signal $\overline{A}[t]$ may be computed from A[t] according to:

$$\overline{A}[t] = \begin{cases} A[t] & A[t] > \alpha_{event}\overline{A}[t-1] \\ \alpha_{event}\overline{A}[t-1] & \text{otherwise} \end{cases} \qquad (12)$$

Here $\alpha_{event}$ controls the decay time of the event control signal. FIGS. 9d and 10d depict the event control signal $\overline{A}[t]$ for the two corresponding audio signals, with the half-decay time of the smoother set to 250 ms. In the first case, one sees that an event boundary is detected for each of the six piano chords, and that the event control signal decays smoothly towards zero after each event. For the second signal, many events are detected very close to each other in time, and therefore the event control signal never decays fully to zero.

One may now use the event control signal $\overline{A}[t]$ to vary the release time constant used for smoothing the gain. When the control signal is equal to one, the smoothing coefficient α[t] from Equation 7a equals $\alpha_{release}$, as before, and when the control signal is equal to zero, the coefficient equals one so that the smoothed gain is prevented from changing. The smoothing coefficient is interpolated between these two extremes using the control signal according to:

$$\alpha[t] = \begin{cases} \alpha_{attack} & G[t] < \overline{G}[t-1] \\ \overline{A}[t]\alpha_{release} + (1 - \overline{A}[t]) & G[t] \geq \overline{G}[t-1] \end{cases} \qquad (13)$$

By interpolating the smoothing coefficient continuously as a function of the event control signal, the release time is reset to a value proportionate to the event strength at the onset of an event and then increases smoothly to infinity after the occurrence of an event. The rate of this increase is dictated by the coefficient $\alpha_{event}$ used to generate the smoothed event control signal.

FIGS. 9e and 10e show the effect of smoothing the gain with the event-controlled coefficient from Equation 13 as opposed to non-event-controlled coefficient from Equation 7b. In the first case, the event control signal falls to zero after the last piano chord, thereby preventing the gain from moving upwards. As a result, the corresponding modified audio in FIG. 9f does not suffer from an unnatural boost of the chord's decay. In the second case, the event control signal never approaches zero, and therefore the smoothed gain signal is inhibited very little through the application of the event control. The trajectory of the smoothed gain is nearly identical to the non-event-controlled gain in FIG. 10b. This is exactly the desired effect.

Loudness Based AGC and DRC

As an alternative to traditional dynamics processing techniques where signal modifications are a direct function of simple signal measurements such as Peak or RMS power, International Patent Application S.N. PCT/US2005/038579 discloses use of the psychoacoustic based loudness model described earlier as a framework within which to perform dynamics processing. Several advantages are cited. First, measurements and modifications are specified in units of sone, which is a more accurate measure of loudness perception than more basic measures such as Peak or RMS power. Secondly, the audio may be modified such that the perceived spectral balance of the original audio is maintained as the overall loudness is changed. This way, changes to the overall loudness become less perceptually apparent in comparison to a dynamics processor that utilizes a wideband gain, for example, to modify the audio. Lastly, the psychoacoustic model is inherently multi-band, and therefore the system is easily configured to perform multi-band dynamics processing in order to alleviate the well-known cross-spectral pumping problems associated with a wideband dynamics processor.

Although performing dynamics processing in this loudness domain already holds several advantages over more traditional dynamics processing, the technique may be further improved through the use of auditory events to control various parameters. Consider the audio segment containing piano chords as depicted in 27a and the associated DRC shown in FIGS. 10b and c. One could perform a similar DRC in the loudness domain, and in this case, when the loudness of the final piano chord's decay is boosted, the boost would be less apparent because the spectral balance of the decaying note would be maintained as the boost is applied. However, a better solution is to not boost the decay at all, and therefore one may advantageously apply the same principle of controlling attack and release times with auditory events in the loudness domain as was previously described for the traditional DRC.

Figure 11:
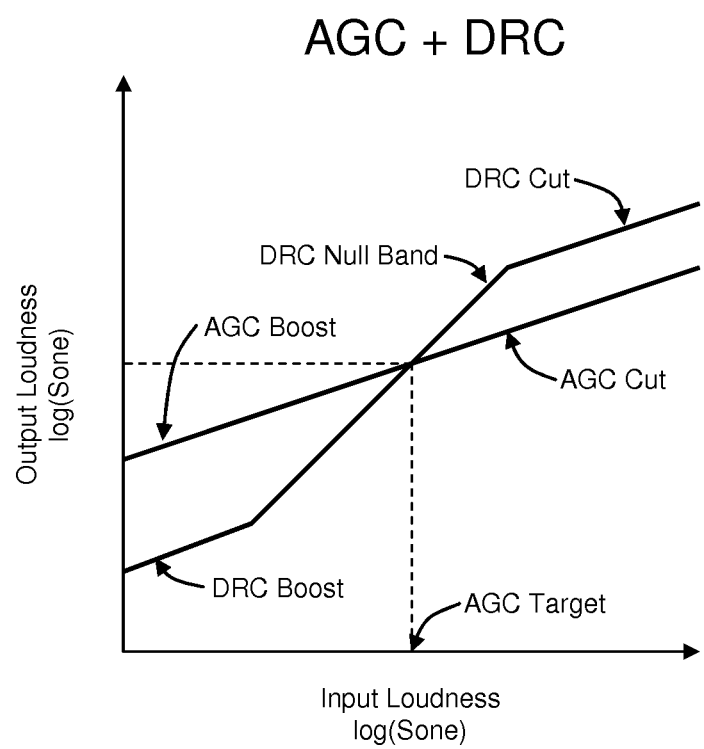
FIG. 11 depicts a suitable set of idealized AGC and DRC curves for the application of AGC followed by DRC in a loudness domain dynamics processing system. The goal of the combination is to make all processed audio have approximately the same perceived loudness while still maintaining at least some of the original audio's dynamics.

The loudness domain dynamics processing system that is now described consists of AGC followed by DRC. The goal of this combination is to make all processed audio have approximately the same perceived loudness while still maintaining at least some of the original audio's dynamics. FIG. 11 depicts a suitable set of AGC and DRC curves for this application. Note that the input and output of both curves is represented in units of sone since processing is performed in the loudness domain. The AGC curve strives to bring the output audio closer to some target level, and, as mentioned earlier, does so with relatively slow time constants. One may think of the AGC as making the long-term loudness of the audio equal to the target, but on a short-term basis, the loudness may fluctuate significantly around this target. Therefore, one may employ faster acting DRC to limit these fluctuations to some range deemed acceptable for the particular application. FIG. 11 shows such a DRC curve where the AGC target falls within the "null band" of the DRC, the portion of the curve that calls for no modification. With this combination of curves, the AGC places the long-term loudness of the audio within the null-band of the DRC curve so that minimal fast-acting DRC modifications need be applied. If the short-term loudness still fluctuates outside of the null-band, the DRC then acts to move the loudness of the audio towards this null-band. As a final general note, one may apply the slow acting AGC such that all bands of the loudness model receive the same amount of loudness modification, thereby maintaining the perceived spectral balance, and one may apply the fast acting DRC in a manner that allows the loudness modification to vary across bands in order alleviate cross-spectral pumping that might otherwise result from fast acting band-independent loudness modification.

Auditory events may be utilized to control the attack and release of both the AGC and DRC. In the case of AGC, both the attack and release times are large in comparison to the temporal resolution of event perception, and therefore event control may be advantageously employed in both cases. With the DRC, the attack is relatively short, and therefore event control may be needed only for the release as with the traditional DRC described above.

As discussed earlier, one may use the specific loudness spectrum associated with the employed loudness model for the purposes of event detection. A difference signal D[t], similar to the one in Equations 10a and b may be computed from the specific loudness N[b,t], defined in Equation 2, as follows:

$$D[t] = \sum_b |N_{NORM}[b, t] - N_{NORM}[b, t-1]| \qquad (14a)$$

where $$N_{NORM}[b, t] = \frac{N[b, t]}{\max_b \{N[b, t]\}} \qquad (14b)$$

Here the maximum of |N[b,t]| across frequency bands b is used for normalization, although one might employ other normalization factors; for example, the average of |N[b,t]| across frequency bands. If the difference D[t] exceeds a threshold $D_{min}$, then an event is considered to have occurred. The difference signal may then be processed in the same way shown in Equations 11 and 12 to generate a smooth event control signal $\bar{A}[t]$ used to control the attack and release times.

The AGC curve depicted in FIG. 11 may be represented as a function that takes as its input a measure of loudness and generates a desired output loudness:

$$L_o = F_{AGC}\{L_i\} \qquad (15a)$$

The DRC curve may be similarly represented:

$$L_o = F_{DRC}\{L_i\} \qquad (15b)$$

For the AGC, the input loudness is a measure of the audio's long-term loudness. One may compute such a measure by smoothing the instantaneous loudness L[t], defined in Equation 3, using relatively long time constants (on the order of several seconds). It has been shown that in judging an audio segment's long term loudness, humans weight the louder portions more heavily than the softer, and one may use a faster attack than release in the smoothing to simulate this effect. With the incorporation of event control for both the attack and release, the long-term loudness used for determining the AGC modification may therefore be computed according to:

$$L_{AGC}[t] = \alpha_{AGC}[t]L_{AGC}[t-1] + (1 - \alpha_{AGC}[t])L[t] \qquad (16a)$$

where $$\alpha_{AGC}[t] = \begin{cases} \bar{A}[t]\alpha_{AGCattack} + (1 - \bar{A}[t]) & L[t] > L_{AGC}[t-1] \\ \bar{A}[t]\alpha_{AGCrelease} + (1 - \bar{A}[t]) & L[t] \leq L_{AGC}[t-1]. \end{cases} \qquad (16b)$$

In addition, one may compute an associated long-term specific loudness spectrum that will later be used for the multi-band DRC:

$$N_{AGC}[b,t] = \alpha_{AGC}[t]N_{AGC}[b,t-1] + (1-\alpha_{AGC}[t])N[b,t] \qquad (16c)$$

In practice one may choose the smoothing coefficients such that the attack time is approximately half that of the release. Given the long-term loudness measure, one may then compute the loudness modification scaling associated with the AGC as the ratio of the output loudness to input loudness:

$$S_{AGC}[t] = \frac{F_{AGC}\{L_{AGC}[t]\}}{L_{AGC}[t]} \qquad (17)$$

The DRC modification may now be computed from the loudness after the application of the AGC scaling. Rather than smooth a measure of the loudness prior to the application of the DRC curve, one may alternatively apply the DRC curve to the instantaneous loudness and then subsequently smooth the resulting modification. This is similar to the technique described earlier for smoothing the gain of the traditional DRC. In addition, the DRC may be applied in a multi-band fashion, meaning that the DRC modification is a function of the specific loudness N[b,t] in each band b, rather than the overall loudness L[t]. However, in order to maintain the average spectral balance of the original audio, one may apply DRC to each band such that the resulting modifications have the same average effect as would result from applying DRC to the overall loudness. This may be achieved by scaling each band by the ratio of the long-term overall loudness (after the application of the AGC scaling) to the long-term specific loudness, and using this value as the argument to the DRC function. The result is then rescaled by the inverse of said ratio to produce the output specific loudness. Thus, the DRC scaling in each band may be computed according to:

$$S_{DRC}[b,t] = \frac{\frac{N_{AGC}[b,t]}{S_{AGC}[t]L_{AGC}[t]} F_{DRC}\left\{\frac{S_{AGC}[t]L_{AGC}[t]}{N_{AGC}[t]} N[b,t]\right\}}{N[b,t]} \quad (18)$$

The AGC and DRC modifications may then be combined to form a total loudness scaling per band:

$$S_{TOT}[b,t] = S_{AGC}[t] S_{DRC}[b,t] \quad (19)$$

This total scaling may then be smoothed across time independently for each band with a fast attack and slow release and event control applied to the release only. Ideally smoothing is performed on the logarithm of the scaling analogous to the gains of the traditional DRC being smoothed in their decibel representation, though this is not essential. To ensure that the smoothed total scaling moves in sync with the specific loudness in each band, attack and release modes may by determined through the simultaneous smoothing of specific loudness itself:

$$\overline{S}_{TOT}[b,t] = \exp\left(\begin{array}{c} \alpha_{TOT}[b,t]\log(\overline{S}_{TOT}[b,t-1]) + \\ (1-\alpha_{TOT}[b,t])\log(S_{TOT}[b,t]) \end{array}\right) \quad (20a)$$

$$\overline{N}[b,t] = \alpha_{TOT}[b,t]\overline{N}[b,t-1] + (1-\alpha_{TOT}[b,t])N[b,t] \quad (20b)$$

where $$\alpha_{TOT}[b,t] = \begin{cases} \alpha_{TOTattack} & N[b,t] > \overline{N}[b,t-1] \\ \overline{A}[t]\alpha_{TOTrelease} + (1-\overline{A}[t]) & N[b,t] \leq \overline{N}[b,t-1] \end{cases} \quad (20c)$$

Finally one may compute a target specific loudness based on the smoothed scaling applied to the original specific loudness $$\hat{N}[b,t] = \overline{S}_{TOT}[b,t]N[b,t] \quad (21)$$

and then solve for gains G[b,t] that when applied to the original excitation result in a specific loudness equal to the target:

$$\hat{N}[b,t] = \Psi\{G^2[b,t]E[b,t]\} \quad (22)$$

The gains may be applied to each band of the filterbank used to compute the excitation, and the modified audio may then be generated by inverting the filterbank to produce a modified time domain audio signal.

Additional Parameter Control

While the discussion above has focused on the control of AGC and DRC attack and release parameters via auditory scene analysis of the audio being processed, other important parameters may also benefit from being controlled via the ASA results. For example, the event control signal $\overline{A}[t]$ from Equation 12 may be used to vary the value of the DRC ratio parameter that is used to dynamically adjust the gain of the audio. The Ratio parameter, similarly to the attack and release time parameters, may contribute significantly to the perceptual artifacts introduced by dynamic gain adjustments.

Implementation

The invention may be implemented in hardware or software, or a combination of both (e.g., programmable logic arrays). Unless otherwise specified, the algorithms included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

A number of embodiments of the invention have been described. Nevertheless, it will be understood that various modifications may be made without departing from the spirit and scope of the invention. For example, some of the steps described herein may be order independent, and thus may be performed in an order different from that described.

It should be understood that implementation of other variations and modifications of the invention and its various aspects will be apparent to those skilled in the art, and that the invention is not limited by these specific embodiments described. It is therefore contemplated to cover by the present invention any and all modifications, variations, or equivalents that fall within the true spirit and scope of the basic underlying principles disclosed and claimed herein.

INCORPORATION BY REFERENCE

The following patents, patent applications and publications are hereby incorporated by reference, each in their entirety.

Audio Dynamics Processing

Audio Engineer's Reference Book, edited by Michael Talbot-Smith, $2^{nd}$ edition. Limiters and Compressors, Alan Tutton, 2-1492-165. Focal Press, Reed Educational and Professional Publishing, Ltd., 1999.

Detecting and Using Auditory Events

U.S. patent application Ser. No. 10/474,387, "High Quality Time-Scaling and Pitch-Scaling of Audio Signals" of Brett Graham Crockett, published Jun. 24, 2004 as US 2004/0122662 A1.

U.S. patent application Ser. No. 10/478,398, "Method for Time Aligning Audio Signals Using Characterizations Based on Auditory Events" of Brett G. Crockett et al, published Jul. 29, 2004 as US 2004/0148159 A1.

U.S. patent application Ser. No. 10/478,538, "Segmenting Audio Signals Into Auditory Events" of Brett G. Crockett, published Aug. 26, 2004 as US 2004/0165730 A1. Aspects of the present invention provide a way to detect auditory events in addition to those disclosed in said application of Crockett.

U.S. patent application Ser. No. 10/478,397, "Comparing Audio Using Characterizations Based on Auditory Events" of Brett G. Crockett et al, published Sep. 2, 2004 as US 2004/0172240 A1.

International Application under the Patent Cooperation Treaty S.N. PCT/US 05/24630 filed Jul. 13, 2005, entitled "Method for Combining Audio Signals Using Auditory Scene Analysis," of Michael John Smithers, published Mar. 9, 2006 as WO 2006/026161.

International Application under the Patent Cooperation Treaty S.N. PCT/US 2004/016964, filed May 27, 2004, entitled "Method, Apparatus and Computer Program for Calculating and Adjusting the Perceived Loudness of an Audio Signal" of Alan Jeffrey Seefeldt et al, published Dec. 23, 2004 as WO 2004/111994 A2.

International application under the Patent Cooperation Treaty S.N. PCT/US2005/038579, filed Oct. 25, 2005, entitled "Calculating and Adjusting the Perceived Loudness and/or the Perceived Spectral Balance of an Audio Signal" by Alan Jeffrey Seefeldt and published as International Publication Number WO 2006/047600.

"A Method for Characterizing and Identifying Audio Based on Auditory Scene Analysis," by Brett Crockett and Michael Smithers, Audio Engineering Society Convention Paper 6416, 118$^{th}$ Convention, Barcelona, May 28-31, 2005.

"High Quality Multichannel Time Scaling and Pitch-Shifting using Auditory Scene Analysis," by Brett Crockett, Audio Engineering Society Convention Paper 5948, New York, October 2003.

"A New Objective Measure of Perceived Loudness" by Alan Seefeldt et al, Audio Engineering Society Convention Paper 6236, San Francisco, Oct. 28, 2004.

*Handbook for Sound Engineers, The New Audio Cyclopedia*, edited by Glen M. Ballou, 2$^{nd}$ edition. Dynamics, 850-851. Focal Press an imprint of Butterworth-Heinemann, 1998.

*Audio Engineer's Reference Book*, edited by Michael Talbot-Smith, 2$^{nd}$ edition, Section 2.9 ("Limiters and Compressors" by Alan Tutton), pp. 2.149-2.165, Focal Press, Reed Educational and Professional Publishing, Ltd., 1999.

We claim:

1. An audio processing method to generate a second signal by applying dynamic gain modifications to a first signal, the method comprising:

detecting changes in loudness with respect to time in the first signal, identifying as auditory event boundaries changes greater than a threshold in loudness with respect to time in the first signal, wherein an audio segment between consecutive boundaries constitutes an auditory event, and applying a dynamic gain modification to the first signal based on said auditory event to generate the second signal;

wherein the audio processing method is performed by one or more processors.

2. The method according to claim 1 wherein the detecting includes comparing changes in loudness with respect to time in the first signal across frequency bands.

3. The method according to claim 1 wherein the applying a dynamic gain modification modifies a gain-smoothing time constant.

4. The method according to claim 3 wherein the applying a dynamic gain modification modifies a gain-smoothing attack time constant.

5. The method according to claim 3 wherein the applying a dynamic gain modification modifies a gain-smoothing release time constant.

6. The method according to claim 1 wherein loudness is perceptual loudness.

7. The method according to claim 6 wherein the applying a dynamic gain modification modifies a gain-smoothing time constant.

8. The method according to claim 7 wherein the applying a dynamic gain modification modifies a gain-smoothing attack time constant.

9. The method according to claim 7 wherein the applying a dynamic gain modification modifies a gain-smoothing release time constant.

10. The method according to claim 1 wherein the auditory event is a voice segment.

11. The method according to claim 10 wherein the applying a dynamic gain modification modifies a gain-smoothing time constant.

12. A non-transitory computer-readable storage medium encoded with a computer program for causing a computer to perform the method of claim 1.

13. An audio processing method in which a processor receives an input channel and generates an output channel that is generated by applying a dynamic gain modification to the input channel, comprising detecting changes in loudness with respect to time in the audio input channel, identifying as auditory event boundaries changes in loudness greater than a threshold with respect to time in said input channel, wherein an audio segment between consecutive boundaries constitutes an auditory event in the input channel, and generating one or more dynamically-varying parameters in response to the auditory events and/or the degree of change in loudness associated with said auditory event boundaries;

wherein the audio processing method is performed by one or more processors.

* * * * *